(12) United States Patent
Sudo et al.

(10) Patent No.: US 6,301,180 B1
(45) Date of Patent: Oct. 9, 2001

(54) SENSE AMPLIFIER CIRCUIT AND SEMICONDUCTOR STORAGE DEVICE

(75) Inventors: Naoaki Sudo; Hiroyuki Takahashi, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/660,869

(22) Filed: Sep. 13, 2000

(30) Foreign Application Priority Data

Sep. 17, 1999 (JP) ................................................ 11-263961

(51) Int. Cl.[7] ...................................................... G11C 7/02
(52) U.S. Cl. .......................... 365/207; 365/206; 365/202; 365/205; 365/191
(58) Field of Search .............................. 365/185.17, 205, 365/63, 189.01, 189.05, 191, 206, 202, 207

(56) References Cited

U.S. PATENT DOCUMENTS

| Re. 36,993 | * | 12/2000 | Takashima et al. | 365/51 |
|---|---|---|---|---|
| 5,010,524 | * | 4/1991 | Fifield et al. | 365/205 |
| 5,680,347 | * | 10/1997 | Takeuchi et al. | 365/185.17 |
| 5,761,109 | * | 6/1998 | Takashima et al. | 365/63 |
| 5,808,951 | * | 9/1998 | Shimohigashi et al. | 365/205 |
| 5,838,038 | * | 11/1998 | Takashima et al. | 257/301 |
| 5,973,983 | * | 10/1999 | Hidaka | 365/230.03 |
| 6,046,940 | * | 4/2000 | Takeuchi et al. | 365/185.17 |

FOREIGN PATENT DOCUMENTS 4-119597       4/1992   (JP) .
410334670A  * 12/1998   (JP) .

* cited by examiner

*Primary Examiner*—Viet Q. Nguyen
(74) *Attorney, Agent, or Firm*—Darryl G. Walker

(57) ABSTRACT

According to one embodiment, a latch-type sense amplifier can reduce noise at a signal input that may be generated by capacitive coupling of a sense amplifier latch enable signal. A latch-type sense amplifier may include a first transfer gate TG1 between a first input SA1 and a first latch node N1, and a second transfer gate TG2 between a second input SA2 and a second latch node N2. A first transfer gate may include complementary transistors NM1 and PM1. Transistor NM1 can receive a control signal /SE at a control gate while transistor PM1 can receive a complementary control signal SE at a control gate. Transistor NM1 may include a parasitic capacitance C0N and transistor PM1 may include a parasitic capacitance C0P that is essentially equivalent to C0N. In such an arrangement, noise at first input SA1 generated by capacitive coupling of a control signal SE can be reduced and/or cancelled by noise generated by capacitive coupling of a complementary control signal /SE.

6 Claims, 9 Drawing Sheets

SENSE AMPLIFIER CIRCUIT AND SEMICONDUCTOR STORAGE DEVICE

TECHNICAL FIELD

The present invention relates generally to the semiconductor storage devices, and more particularly to latch-type sense amplifier circuits that may be used in semiconductor storage devices.

BACKGROUND OF THE INVENTION

Many conventional semiconductor storage devices typically contain a number of memory cells that can generate some sort of data signal when accessed. For example, a memory cell may generate a particular current and/or voltage differential. Due the desirability of high density semiconductor storage devices, memory cells are typically manufactured to be as small as possible. Consequently, the data signal generated by a memory cell can be correspondingly small. Therefore, an important aspect of many semiconductor storage devices can be the speed at which such small memory cell signals can be amplified and thus "sensed." Typically, an amplifier used to detect a memory cell signal is referred to as a sense amplifier (or sense amp).

While various types of semiconductor storage devices include memory cells and sense amplifiers, one particular semiconductor storage device is currently being used in an increasing number of applications. Nonvolatile storage devices, which can include electrically erasable programmable read only memories (EEPROMs), are becoming increasingly popular due to their ability to retain data in the absence of power. Such a capability can be a valuable feature in portable electronic devices that may run off batteries.

To assist in understanding the various capabilities, features and advantages of the present invention, a conventional EEPROM and its sensing operation will now be described.

Referring now to FIG. 9, a conventional EEPROM is shown in a block schematic diagram. A conventional EEPROM may include a memory cell array 020 having a number of memory cells arranged into rows and columns. Memory cells are indicated by the character ($MC_{km}$), where k may vary from 0–i, and indicate a column, while m may vary from 0–n, and indicate a row.

In the example of FIG. 9, each memory cell may include a transistor with a floating gate. The threshold voltage of such transistors may be affected by the presence or absence of charge on their respective floating gates. In particular, a memory cell transistor may have essentially no charge on its floating gate (be in an initial condition) and therefore have an initial state threshold voltage. In addition, a memory cell transistor may have some charge, due to the addition of electrons to the floating gate (be in a programmed condition). Thus, the threshold voltage in an initial condition can be different from that of a programmed condition.

In one arrangement, memory cell transistors in an initial condition can store a value "1" while memory cell transistors in a programmed condition can store a value "0." In a read operation, a voltage can be applied t o a control gate of a memory cell. According to the condition of the memory cell (e.g., initial or programmed condition) a particular current will flow through the memory cell. As but one example, a memory cell may include an n-channel field effect transistor with a floating gate, in which case a programmed condition will have a higher threshold voltage than an initial condition. Accordingly, in response to a voltage at its gate, a memory cell in an initial state may draw less current than a memory cell in a programmed state. In some conventions a memory cell in an initial state can be referred to as an "on" memory cell while a memory cell in a programmed state can be referred to as a "off" memory cell.

In many configurations, a number of memory cells can be connected to a digit line. In a read operation, a selected memory cell can be connected to a single digit line. Thus, a typical EEPROM arrangement will detect a current drawn on a digit line when reading data from a selected memory cell. Because EEPROM memory cells usually draw a current, an EEPROM device will often include current-to-voltage (I-V) converter circuits that can converts a memory cell current into a voltage. Such a voltage may then be compared to a reference voltage and amplified in a sense amplifier to generate a logic "1" or "0." The operation of I-V converter circuits and associated sense amplifiers will be discussed in more detail below.

In the particular EEPROM configuration of FIG. 9, memory cells ($MC_{00}$–$MC_{in}$) of the same row may be commonly connected to a word line. Such word lines may be connected to a word line driving circuit 010. A row decoder circuit (not shown) can decode a row address from an input signal, and provide such decoded values as inputs to a word line driving circuit 010. In response to such inputs, a word line driving circuit 010 can drive the word lines. A driven word line can connect memory cells ($MC_{00}$–$MC_{in}$) to digit lines, thereby selecting the memory cells ($MC_{00}$–$MC_{in}$).

In FIG. 9, memory cell transistors may have drains connected to digit lines $DIG_0$–$DIG_i$ in a column-wise fashion. Digit lines ($DIG_0$–$DIG_i$) can be selected by a column decoder (not shown) and connected to corresponding I-V converter circuits 030₀–030ᵢ in various ways. A column decoder may decode a column address to generate column select signals for selecting particular digit lines. As but one example, a column decoder may provide direct connections between digit lines ($DIG_0$–$DIG_i$) and I-V converter circuits (030₀–030ᵢ). As but another of the many possible examples, digit lines may have a layered and/or hierarchical arrangement that includes main digit lines and sub-digit lines. In such an arrangement, the drains of memory cell transistors may be connected to sub-digit lines. A column switch circuit (not shown) may then connect a memory cell to a I-V converter circuit (030₀–030ᵢ) by way of a sub-digit line and corresponding main digit line.

Referring again to FIG. 9, I-V converter circuits (030₀–030ᵢ) can convert a current value, taken from the current flowing in a digit line ($DIG_0$–$DIG_i$) into a voltage value ($SAVD_0$–$SAVD_i$). Such a voltage value can then be supplied to sense amplifier circuits (050₀–050ᵢ).

An EEPROM according to FIG. 9 may further include a reference cell 021 and corresponding I-V converter circuit, also referred to as a reference voltage generating circuit 040. In one particular arrangement, a reference cell 021 may include an on (initial condition) cell, shown as "ON Cell" and an off (programmed condition) cell, shown as "OFF Cell." An on cell current can be drawn in a digit line DIGRON connected to the ON Cell. An off cell current can be drawn on a digit line DIGROFF connected to the OFF Cell.

A reference voltage generating circuit 040 can receive current values from the DIGRON and DIGROFF lines as inputs. In response to such inputs, a reference voltage generating circuit 040 may generate a reference voltage VREF that can be halfway between a voltage generated in response to the DIGRON current and a voltage generated in response to a DIGROFF current.

As shown in FIG. 9, each sense amplifier circuit ($050_0$–$050_i$) may include a first input SA1 and second input SA2. A first input SA1 may receive an input voltage $SAVD_0$–$SAVD_i$ from a corresponding I-V converter circuit ($030_0$–$030_i$). The second inputs SA2 can receive a reference voltage VREF from reference voltage generating circuit 040.

Sense amplifier circuits ($050_0$–$050_i$) may further receive a sense amplifier latch activating signal BSAL. In response to the sense amplifier latch activating signal BSAL, each sense amplifier circuit ($050_0$–$050_i$) can latch and amplify a voltage difference between its inputs SA1 and SA2. Such amplified voltage differences may be provided as amplifier output signals $TDIO_0$–$TDIO_i$.

Amplifier output signals $TDIO_0$–$TDIO_i$ may be provided to an internal bus 060. Amplifier output signals ($TDIO_0$–$TDIO_i$) on an internal bus 060 may then be provided as on output terminals as data out values $DO_0$–$DO_i$.

It is noted that the various sense amplifier circuits ($050_0$–$050_i$) of FIG. 9 may be latch-type sense amplifiers. FIG. 10 shows one example of a latch-type sense amplifier.

Referring now to FIG. 10, a conventional latch-type sense amplifier may include input transistors NM1 and NM2. In the particular example illustrated, input transistors (NM1 and NM2) may include n-channel field effect transistors. Input transistor NM1 may have a source-drain path connected between an input terminal SA1 and an amplifier terminal A1. Similarly, input transistor NM2 may have a source-drain path connected between an input terminal SA2 and an amplifier terminal A2. The gates of input transistors NM1 and NM2 may commonly receive a sense amplifier activating signal /SE. A sense amplifier activating signal /SE can correspond to sense amplifier latch activating signal BSAL shown in FIG. 9. An input terminal SA1 may receive a voltage corresponding to a memory cell data value. Such a voltage may be provided by a I-V converter circuit, for example. An input terminal SA2 may receive a reference voltage VREF that may be provided by a reference voltage generating circuit, for example.

It is understood that input transistors NM1 and NM2 may include sources connected to input terminals (SA1 and SA2) and drains connected to amplifier terminals (A1 and A2), or vice versa. Thus, such transistors may be conceptualized as including one source/drain terminal connected to an input (SA1 or SA2) and another source/drain terminal that is connected to an amplifier terminal (A1 or A2).

In the operation of a latch-type sense amplifier of FIG. 10, a sense amplifier activating signal /SE may initially be high, turning on input transistors NM1 and NM2. Once a differential voltage is generated between input terminals SA1 and SA2 (and hence between amplifier terminals A1 and A2), a sense amplifier activating signal /SE can transition low, turning off input transistors NM1 and NM2. A latch circuit 001 may then amplify and latch the voltage differential between amplifier terminals (A1 and A2).

A more detailed example of a latch-type sense amplifier circuit will now be described with reference to FIG. 11.

A latch-type sense amplifier circuit according to FIG. 11 may include some of the same general constituents as the circuit of FIG. 10. In particular, FIG. 11 shows a sense amplifier latch activating signal BSAL which can correspond to the sense amplifier activating signal /SE of FIG. 10. Further, FIG. 11 includes input transistors NM59 and NM60, which can correspond to input transistors NM1 and NM2 of FIG. 10. In addition, FIG. 11 shows a latch circuit 001 that can correspond to the latch circuit 001 of FIG. 10. A first node N1 of latch circuit 001 can correspond to a amplifier terminal A1, a second node N2 of latch circuit 001 can correspond to a amplifier terminal A2.

A latch circuit 001 in FIG. 11 may include circuits that can amplify and latch a voltage differential generated between a first node N1 and a second node N2. As but one example, a latch circuit 001 may include cross-coupled inverters, where the input of a first inverter and output of a second inverter are connected to a first node N1, while the input of the second inverter and output of the first inverter are connected to a second node N2.

In the very particular example of FIG. 11, a latch circuit 001 may include a first complementary metal-oxide-semiconductor (CMOS) inverter that includes transistors PM51 and NM51, a second CMOS inverter that includes transistors PM52 and NM52, a first supply device that includes transistor PM53, and a second supply device that includes transistor NM53. A first supply transistor PM53 may be a p-channel transistor with a source connected to a first supply voltage VDD, a gate that receives a sense amplifier latch activating signal BSAL, and a drain that is commonly connected to the sources of first inverter transistor PM51 and second inverter transistor PM52. First and second inverter transistors (PM51 and PM52) may be p-channel transistors.

A second supply transistor NM53 may be an n-channel transistor with a source connected to a second supply voltage VSS, a gate that receives the sense amplifier latch activating signal BSAL as inverted by an inverter INV52, and a drain that is commonly connected to the sources of first inverter transistor NM51 and second inverter transistor NM52. First and second inverter transistors (NM51 and NM52) may be n-channel transistors.

The drains of first inverter transistors (PM51 and NM51) and gates of second inverter transistors (PM52 and NM52) may be commonly connected to a first node N1. Similarly, the drains of second inverter transistors (PM52 and NM52) and gates of first inverter transistors (PM51 and NM51) may be commonly connected to a second node N2.

A latch circuit included in a sense amplifier is further described Japanese Laid-Open Patent Publication No. 4-119597.

A conventional latch-type sense amplifier may further include various output circuits. In the particular arrangement of FIG. 11, such output circuits include a first node driver, formed by first node driver transistors PM54 and NM54, a second node driver, formed by second node transistors PM55 and NM55, and a driver supply device NM56. In addition, such output circuits may further include disable devices PM56 and PM57, as well as output inverters INV53, INV54 and INV55. An output signal TDIOk from a conventional latch-type sense amplifier circuit may be generated by an output stage that includes driver transistors PM58 and NM58.

In the example of FIG. 11, a first node driver may take the form of a CMOS inverter and include an input connected to node N1 and an output connected to a first output control node N3. Similarly, a second node driver may take the form of a CMOS inverter having an input connected to node N2 and an output connected to a second output control node N4. First and second node driver transistors PM54 and PM55 may be p-channel transistors having sources connected to a power supply voltage VDD. First and second node driver transistors NM54 and NM55 may be n-channel transistors having sources connected to the source-drain path of driver supply device NM56.

In the particular arrangement of FIG. 11, driver supply device NM56 may include an n-channel transistor having a drain commonly connected to the sources of first and second node driver transistors NM54 and NM55, a source connected to a second power supply voltage VSS, and a gate that receives an inverted sense amplifier latch activating signal SAL from inverter INV52.

Output control node N3 may be connected to the output of first node driver PM54/NM54 and to the input of output inverter INV53. At the same time, output control node N4 may be connected to the output of second node driver PM55/NM55 and to the input of output inverter INV55. Both output control nodes (N3 and N4) can be placed at a disable potential by disable devices PM56 and PM57. More particularly, output disable devices PM56 and PM57 may be p-channel transistors having drains connected to output control nodes N3 and N4, respectively, sources connected to a first power supply voltage VDD, and gates connected to the output of an inverter INV51. Inverter INV51 can invert a sense amplifier latch activating signal BSAL to generate the signal inverse SAL. In the particular example of FIG. 11, a disable potential may be the first power supply potential, as will be described in more detail below.

Referring again to FIG. 11, inverters INV53 and INV54 can be connected in series between a first output control node N3 and a first driver device PM58. Inverter INV55 can be connected between a second output control node N4 and a second driver device NM58. In the example of FIG. 11, first driver device PM58 can include a p-channel transistor while second driver device NM58 may include an n-channel transistor. More particularly, first driver device PM58 can have a source connected to a first power supply voltage VDD, a drain connected to an output node, and a gate connected to the output of inverter INV54. A second driver device NM58 can include an n-channel transistor having a source connected to a low power supply voltage VSS, a drain connected to the output node (and hence the drain of first driver device P58), and a gate connected to the output of inverter INV55. Driver devices PM58 and NM58 may function as an output stage buffer circuit that drives an internal bus with an amplifier output TDIOk (where k may vary from 1 to i).

It is noted that power supply voltages are not necessarily limited to external voltages supplied to a semiconductor storage device. As but one example, a first power supply voltage VDD may be a "stepped-down" voltage generated by reducing an externally supplied voltage.

Having described the various portions of the particular latch-type sense amplifier circuit of FIG. 11, the operation of the circuit will now be described.

A sense amplifier latch activating signal BSAL may be initially inactive (high in example). With the BSAL signal high, input transistors NM59 and NM60 may be turned on, allowing a differential voltage to be developed across nodes N1 and N2. For example, with input transistor NM59 turned on, an output voltage from an I-V converter circuit $SAVD_k$ can be placed on a node N1 while a reference voltage VREF from a reference voltage generating circuit can be placed on node N2.

Within latch 001, with BSAL inactive, first supply device PM53 can be turned off, isolating cross-coupled inverters (PM51/NM51 and PM52/NM52) from a high power supply voltage VDD. Similarly, a low SAL signal generated by inverter INV52 can turn off second supply device NM53, isolating cross-coupled inverters (PM51/NM51 and PM52/NM52) from a low power supply voltage VSS. In this way, an inactive BSAL signal can result in latch 001 being inactive.

In addition, with the BSAL signal inactive, a low SAL signal can turn off driver supply device NM56. With NM56 turned off, first and second node drivers (PM54/NM54 and PM55/NM55) can be isolated from a low power supply voltage, and thus deactivated. Further, an inactive BSAL signal can result in disable devices PM56 and NM56 being turned on. Thus, a first output control node N3 and second output control node N4 can be placed at a high potential.

A high potential at first output control node N3 can result in the gate of first driver device PM58 being driven high by inverters INV53 and INV54. Consequently, first driver device PM58 can be turned off. A high value at second output control node N4 can result in the gate of second driver device NM58 being driven low by inverter INV55. Consequently, second driver device NM58 can be turned off. In this way, an inactive BSAL signal can result in an output driver stage PM58/NM58 being inactive and an output terminal being placed in a high-impedance state.

A sense amplifier latch activating signal BSAL may then transition to an active state (low in this example). With the BSAL signal low, input transistors NM59 and NM60 may be turned off, isolating a differential voltage on nodes N1 and N2 from input nodes SA1 and SA2. As noted above, such a differential voltage may be the difference between the output of an I-V converter circuit $SAVD_k$ and a reference voltage VREF.

Within latch 001, with BSAL active, first supply device PM53 can be turned on, supplying cross-coupled inverters (PM51/NM51 and PM52/NM52) with a high power supply voltage VDD. In addition, a high SAL signal generated by inverter INV52 can turn on second supply device NM53, supplying a low power supply voltage VSS to cross-coupled inverters (PM51/NM51 and PM52/NM52). In this way, an active BSAL signal can result in the activation of latch 001.

With latch 001 active, nodes N1 and N2 can be driven to complementary values according to the initial potential across the nodes (N1 and N2) thereby latching a data value. For example, if a potential at node N1 ($SAVD_k$) was greater than that at node N2 (VREF), node N1 could be driven to a high power supply voltage VDD while node N2 could be driven to a low power supply voltage VSS. Such an operation may be the case when a memory cell in an initial condition is read. Conversely, a potential at node N1 ($SAVD_k$) can be less than that at node N2 (VREF). As a result, node N1 could be driven to the low power supply voltage VSS while node N2 could be driven to the high power supply voltage VDD. Such an operation can occur when a memory cell in a programmed condition is read. In this way, an active BSAL signal can result in an input signal being amplified and latched in latch 001.

In addition, with the BSAL signal active, a high SAL signal can turn on driver supply device NM56, thereby enabling first and second node drivers (PM54/NM54 and PM55/NM55). At essentially the same general time, disable devices PM56 and PM57 can both be turned off. Once enabled, first and second node drivers (PM54/NM54 and PM55/NM55) can drive output control nodes N3 and N4 according to the potential at nodes N1 and N2, respectively. More particularly, if nodes N1 and N2 are driven high and low, respectively, nodes N3 and N4 can be driven low and high respectively. Further, if nodes N1 and N2 are driven low and high, respectively, nodes N3 and N4 can be driven high and low, respectively. In this way, when the BSAL signal is active, nodes N3 and N4 can be driven to complementary values according to a data value in latch 001.

First and second driver devices (PM58 and NM58) can be controlled according to the various potentials at output control nodes N3 and N4. Thus, when output control nodes N3 and N4 are high and low, respectively, inverters INV53 and INV54 can drive the gate of first driver device PM58 high, thereby turning off first driver device PM58. At the same time, inverter INV55 can drive the gate of second driver device NM58 high, thereby turning on first driver device NM58, and driving amplifier output TDIO$_k$ low. In this way, a low output value can be generated when a latch 001 is activated and a node N1 is at a lower potential than a node N2. When output control nodes N3 and N4 are low and high, respectively, inverters INV53 and INV54 can drive the gate of first driver device PM58 low, thereby turning on first driver device PM58 and driving internal bus TDIO$_k$ high. At the same time, inverter INV55 can drive the gate of second driver device NM58 low, thereby turning off first driver device NM58. In this way, a high output value can be generated when a latch 001 is activated and a node N1 is at a higher potential than a node N2.

Referring now to FIG. 12, the operation of a non-volatile semiconductor storage device will now be described that includes a conventional latch-type sense amplifier, such as that shown in FIGS. 10 and 11. FIG. 12 is a timing diagram that shows applied address values A1, a sense amplifier activating signal BSA, a precharging signal TSAPC, a sense amplifier latch activating signal BSAL, an internal bus output signal (amplifier output signal) TDIO$_k$, and a data output signal DO$_k$.

Referring now to FIG. 12 in conjunction with FIG. 9, at time t1, an address can make a transition to a new read address. Such a read address may be decoded by a row address decoder and a column address decoder (both not shown).

At time t2, a sense amplifier activation signal BSA can become active (low in this example). An active sense amplifier activation signal BSA can activate I-V converter circuits 030$_k$ (where k=0–i) and a reference voltage generating circuit 040. Also at time t2, an equalization signal TSAPC can be activated. An active equalization signal TSAPC can precharge digit lines DIG$_0$–DIG$_i$ to a predetermined potential.

At time t3, an equalization signal TSAPC can return to an inactive state, disabling precharge circuits. Thereafter, in response to the applied read address A1, at least one memory cell can be selected, resulting in current being drawn on a digit line. Such a current can be converted to a voltage by a I-V converter circuit 030$_k$ and the resulting voltage SAVD$_k$ can be applied to a first input of a latch-type sense amplifier 050$_k$. Because a sense amplifier latch activating BSA can be inactive, such a voltage can be provided to a latch circuit node within the sense amplifier. At the same general time, a reference voltage generating circuit 040 can generate a reference voltage VREF in response to DIGRON and DIGROFF currents. Such a reference voltage VREF can be applied to a second input of a latch-type sense amplifier 050$_k$. Because a sense amplifier latch activating BSA can be inactive, such a voltage can be provided to another latch circuit node within the sense amplifier.

Between times t4 and t5, a sense amplifier latch activating signal BSAL can be activated, resulting in latch-type sense amplifiers 050$_k$ amplifying and latching a data value. Thus, an internal bus output signal TDIO$_k$ can transition (assuming a change in data value) between times t4 and t5. A corresponding transition can then occur for a data output signal DO$_k$.

While a conventional approach such as that shown in FIGS. 9–12 may provide sensing of memory cell data values, such a conventional approach may include drawbacks.

One drawback can include noise generated at sense amplifier inputs due to capacitive coupling of a sense amplifier enable signal /SE (and BSAL). More particularly, if reference is made to both FIGS. 10 and 11, a parasitic capacitance C0 may exist between the gates and drains of input transistors (NM1 and NM2, NM59 and NM60). These input transistor gates may receive a sense amplifier enable signal /SE (or BSAL). However, in operation, a parasitic load capacitance may also be connected input nodes SA1 and SA2. For example, an additional parasitic capacitance C1 can be connected to input node SA1 while an additional parasitic capacitance C2 can be connected to input node SA2. Further, there can be a considerable difference in capacitance between C1 and C2. Thus, variations in potential due to noise can differ between first and second inputs SA1 and SA2. Such variations due to noise will now be described in more detail.

In a conventional sense amplifier, such as that shown in FIG. 10, when a sense amplifier enable signal /SE transitions from a high level to a low level, noise can be generated at first input SA1 due to the gate-drain capacitance Cgd of input transistor NM1. Simultaneously, noise can be generated at second input SA1 due to gate-drain capacitance of input transistor NM2. In FIG. 10, the gate-drain capacitance of transistors NM1 and NM2 are shown as C0. Of course, if the transistor terminals connected to input nodes SA1 and SA2 were sources, a parasitic capacitance CO could be considered a gate-source capacitance Cgs of transistors NM1 and NM2.

As previously shown in FIG. 9, a first input SA1 of the various sense amplifiers (050$_0$–050$_i$) may include a first input SA1 that is connected to a particular I-V converter circuit (030$_0$–030$_i$). The capacitance of such a connection can be represented by a load capacitance C1 and is shown by example in FIG. 9 at the output of I-V converter circuit 030$_0$. In addition, each sense amplifier (050$_0$–050$_i$) may also include a second input SA2 connected to a reference voltage generating circuit 040. The capacitance of such a connection can be represented by a load capacitance C2 and is shown by example in FIG. 9 at the output of reference signal generating circuit 040.

Because a reference voltage generating circuit 040 may be connected to many sense amplifiers (050$_0$–050$_i$), and a I-V converter circuit (030$_0$–030$_i$) may be connected to one sense amplifier (050$_0$–050$_i$), a load capacitance C2 may be considerably larger than a load capacitance C1. As but one example, in an arrangement such as that shown in FIG. 9, the number of sense amplifiers could be eight. In such a case, a load capacitance C2 at the output of a reference voltage generating circuit 040 can be approximately eight times that of a load capacitance C1 at the output of a I-V converter circuit (030$_0$–030$_i$).

A resulting voltage change at the inputs of a sense amplifier circuit due to noise will now be described in more detail. It will be assumed that a sense amplifier circuit can include input transistors such as NM1 and NM2 (FIG. 10) or NM59 and NM60 (FIG. 11) connected to inputs SA1 and SA2. Such transistors may include a gate-drain capacitance Cgd (if transistors drains are connected to inputs SA1 and SA2) or a gate-source capacitance Cgs (if transistors sources are connected to inputs SA1 and SA2) of C0. Further, as described above, circuitry, including an interconnect or the like, can present a load capacitance at input SA1 of C1 and a load capacitance at input SA1 of C2. It will further be assumed that the gates of such input transistors can receive a signal (such as /SE in FIG. 10 or BSAL in FIG. 11) that makes a transition having an amplitude of V.

A potential change VSA1 at input node SA1 due to capacitive coupling can approximately be given as set forth below.

$$VSA1=(C0/(C0+C1))\times V$$

A potential change VSA2 at input node SA2 due to capacitive coupling can approximately be given as set forth below.

$$VSA2=(C0/(C0+C2))\times V$$

As noted above, C2 may be considerably larger than C1. Consequently, a change in potential VSA1 can be larger than the change in potential VSA2.

A difference in the change of potential at input nodes SA1 and SA2 may lead to slower or even erroneous read operations. This may be understood with reference to FIG. 13.

FIG. 13 is a timing diagram generated by a circuit simulation SPICE® that shows the response of a conventional latch-type sense amplifier such as that shown in FIG. 12. FIG. 13 includes various responses and signal. A sense amplifier latch activating signal BSAL can transition from a high level to a low level. Also included are two output signals TDIOi(ON) and TDIOi(OFF). TDIOi(ON) can represent an output signal corresponding to an "on" memory cell (i.e., a memory cell in an initial condition). TDIOi(OFF) can represent an output signal corresponding to an "off" memory cell (i.e., a memory cell in a programmed condition).

Input waveforms corresponding to such different types of memory cells are also shown. A waveform SAVDi(ON) can represent the voltage at a first input, such as SA1, that may result when an on memory cell is read. A waveform SAVDi (OFF) can represent the voltage at a first input, such as SA1, that may result when an off memory cell is read. Responses SAVDi(ON) and SAVDi(OFF) may be provided by a I-V converter circuit, or the like. A waveform VREF can represent the voltage at a second input, such as SA2. Such a voltage may be provided by a reference voltage generating circuit, or the like. Thus, if an on memory cell is read, the voltage at node SA1 (SAVDi(ON)) can initially be greater than VREF. Conversely, if an off memory cell is read, the voltage at node SA1 (SAVDi(OFF)) can initially be less than VREF.

Various responses to inputs to a latch circuit within a sense amplifier are also shown. In particular, the response at a first latch input for an on memory cell is shown as A1(ON), while the response at a first latch input for an off memory cell is shown as A1(OFF). Similarly, response at a second latch input for an on memory cell is shown as A2(ON), while the response at a second latch input for an off memory cell is shown as A2(OFF).

Thus, ideally, when an on (e.g., initial condition) memory cell is read, SA1 can remain above VREF. This difference in potential can be amplified and latched by a latch to cause A1(ON) to go high and A2(ON) to go low. When an off (e.g., programmed) memory cell is read, ideally, SA1 can remain below VREF. This difference in potential can be amplified and latched by a latch to cause A1(OFF) to go high and A2(OFF) to go low.

However, noise due to capacitive coupling can produce non-ideal responses. For example, as shown in FIG. 13, a sense amplifier latch activating signal BSAL can transition from high to low. Due to capacitive coupling, such a transition can result in a voltage drop at a first input SA1. This is represented in FIG. 13 by a dip in the values of SAVDi(ON) and SAVDi(OFF) at time TA. Further, due to the differences in load capacitance between a first input SA1 and a second input SA2, a voltage drop at a second input SA2 can be considerably smaller. Thus, as shown in FIG. 13, at time TA, a response SAVDi(ON) at a first input SA1 may undesirably fall below a reference voltage VREF at a second input SA2.

In one particular example, prior to a transition in the sense amplifier latch activating signal BSAL, the difference between the voltage at a first node SA1 (SAVDi(ON) and/or SAVDi(OFF)) and the voltage at a second node SA2 (VREF) can be as small as 50 mV. However, a voltage change due to a transition in a BSAL signal and capacitive coupling can result in changes at a first node SA1 (SAVDi(ON) and/or SAVDi(OFF)) that can be high as high as 100 mV. At the same time, due to differences in load capacitance, a corresponding voltage change at a second node SA2 (VREF) that can be as small as several tens of mV.

If sensing (i.e., amplification and/or latching of a value at first and second inputs SA1 and SA2) occurs while noise due to switching is present at the inputs, erroneous results may occur as a value SAVDi(ON) may be less than that of VREF. Thus, to avoid such erroneous results, conventional approaches may have to wait until a proper differential is developed by a sense amplifier (i.e., the inputs are essentially free of such noise from switching). Said in another way, sufficient timing margin can be included in a sense amplifier activation operation to ensure input nodes are at a desired level before a sense amplifier amplifies data.

In light of the above discussion, it would be desirable to arrive at some way of improving the sensing speeds of a semiconductor storage device. More particularly, it would be desirable to improve the sensing speed of a semiconductor storage device that may include I-V converter circuits that convert a memory cell current to a voltage that can be sensed by a latch-type sense amplifier.

SUMMARY OF THE INVENTION

According to the disclosed embodiments of the present invention, a semiconductor storage device may include current-to-voltage (I-V) converter circuits can be connected to digit lines. A current may flow through a digit line when a memory cell is selected. A current on a digit line may be converted into a voltage by an I-V converter circuit, and the voltage may be provided as one input to a latch-type sense amplifier. A reference voltage generator circuit may provide a reference voltage to other inputs of a number of latch-type sense amplifiers.

Within each latch-type sense amplifier, a first input may be connected to a first amplifier node by a first transfer switch. A second input may be connected to a second amplifier node by second transfer switch. A first transfer switch may include a first transistor that receives a control signal at a first control gate and a second transistor that receives a complementary control signal at a second control gate. A second transistor may include a parasitic capacitance equivalent to that of the first transistor. A transition in the control signal can generate a first noise component at the first input due to the parasitic capacitance of the first transistor. However, a corresponding opposite transition in the complementary control signal can generate a second noise component at the first input that can cancel at least a portion of the first noise component.

According to one aspect of the embodiments, a first transistor may include an n-channel transistor and a second transistor may include a p-channel transistor. The source-drain paths of first and second transistors may be connected in parallel between the first input and the first amplifier node.

According to another aspect of the embodiments, the first and second transistors may both include n-channel transistors. The source-drain paths of the first transistor may be connected between the first input and the first amplifier node. The source and drain of the second transistor may be commonly connected to the first input.

According to another aspect of the embodiments, the third transistor may include an n-channel transistor having a source-drain path connected between the second input and the second amplifier node.

According to another aspect of the embodiments, a second transfer switch may include a fourth transistor. A fourth transistor can be a p-channel transistor and have the complementary control signal at its gate and include a source-drain path connected between the second input and the second amplifier node. Alternatively, a fourth transistor may include an n-channel transistor with a source and drain commonly connected to the second input.

DETAILED DESCRIPTION OF THE EMBODIMENTS

Various embodiments of the present invention will now be described to in detail with reference to a number of drawings.

In particular embodiments of the present invention, a semiconductor storage device may include memory cells that provide at least two types of current inputs (e.g., on or off) to a current-to-voltage (I-V) converter circuit. Data may be read from a memory cell by amplifying the difference in voltage between an output of a I-V converter circuit and a reference voltage. A reference voltage may be provided by a reference voltage generating circuit that is commonly input to a number of latch-type sense amplifiers. Latch-type sense amplifiers may include an input section with transfer gates that are controlled by a control signal.

Noise generated at inputs to the sense amplifier, due to capacitive coupling of the control signal, may be reduced and/or cancelled by generating essentially complementary noise signals at the inputs of the sense amplifiers. According to one particular embodiment, input section transfer gates may include two transistors, where one transistor has a gate that receives a control signal and another transistor has a gate that receives a complementary control signal. The two transistors may be complementary metal(conductor)oxide (insulator)-semiconductor (CMOS) type transfer gates. Alternatively, the two transistors may be of the same conductivity type, with one transistor having a capacitor-type connection.

Figure 2:
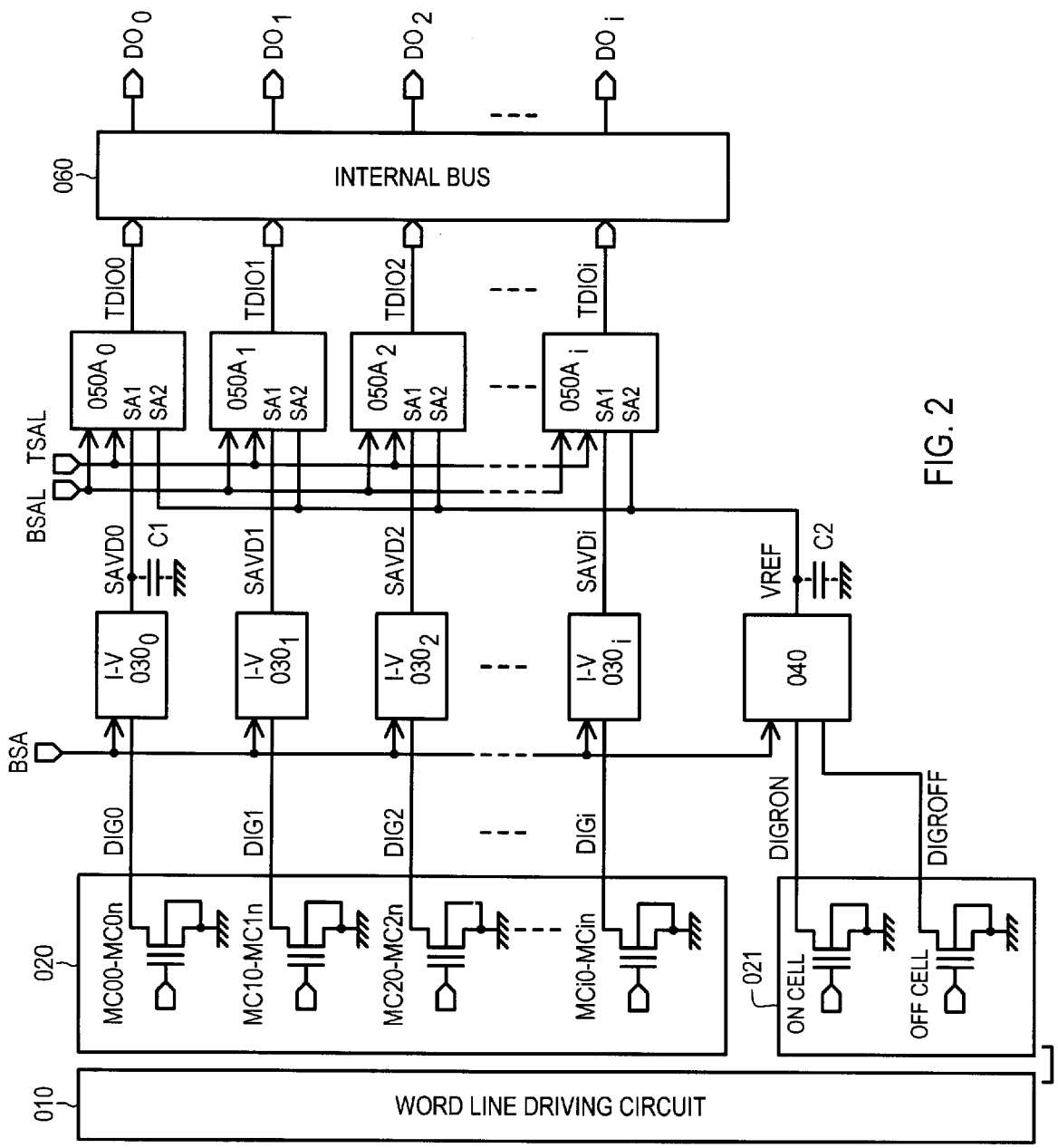
FIG. 2 is a block schematic diagram of a first embodiment of the present invention.

A first embodiment of the present invention will now be discussed with reference to FIG. 2. FIG. 2 shows a semiconductor storage device that may include a word line driving circuit 010, a memory cell array 020, a reference voltage generating circuit 021, and I-V converter circuits ($030_0$–$030_i$). A word line driving circuit 010 may activate one or more selected word lines within a memory cell array 020. Once activated, a word line can connect a memory cell to a corresponding digit line ($DIG_1$–$DIG_i$). When connected, a memory cell can draw a current according to its particular conditions (e.g., initial or programmed).

In the example of FIG. 2, memory cells MC00–MC0$_n$ are connected to digit line DIG0, memory cells MC10–MC1n are connected to digit line DIG1, etc . . . Further, the convention will be used where a memory cell in an initial condition can draw more current than a memory cell in a programmed condition.

A current drawn by a memory cell on a digit line ($DIG_0$–$DIG_i$) can be converted into a voltage by corresponding I-V converter circuits ($030_0$–$030_i$) controlled by a sense amplifier activating signal BSA. Various voltage outputs of I-V converter circuits ($030_0$–$030_i$) are shown as $SAVD_0$–$SAVD_i$.

In one particular arrangement, a reference voltage generating circuit 021 may include an "on" memory cell ON CELL (e.g., one that is in an initial condition) and an "off" memory cell (e.g., one that is a programmed condition). An ON CELL may draw an on reference current on a line DIGRON while an OFF CELL may draw an off reference current on a line DIGROFF. Currents drawn on DIGRON and DIGROFF lines can be detected by a reference voltage generating circuit 040 that can provide a reference voltage VREF as an output.

A semiconductor storage device according to FIG. 2 may further include latch-type sense amplifier circuits 050A$_0$–050A$_i$. Latch-type sense amplifier circuits 050A$_0$–050A$_i$ can include first inputs SA1 that may receive voltage outputs ($SAVD_0$–$SAVD_i$) and second inputs SA2 that may receive a reference voltage VREF.

Figure 9:
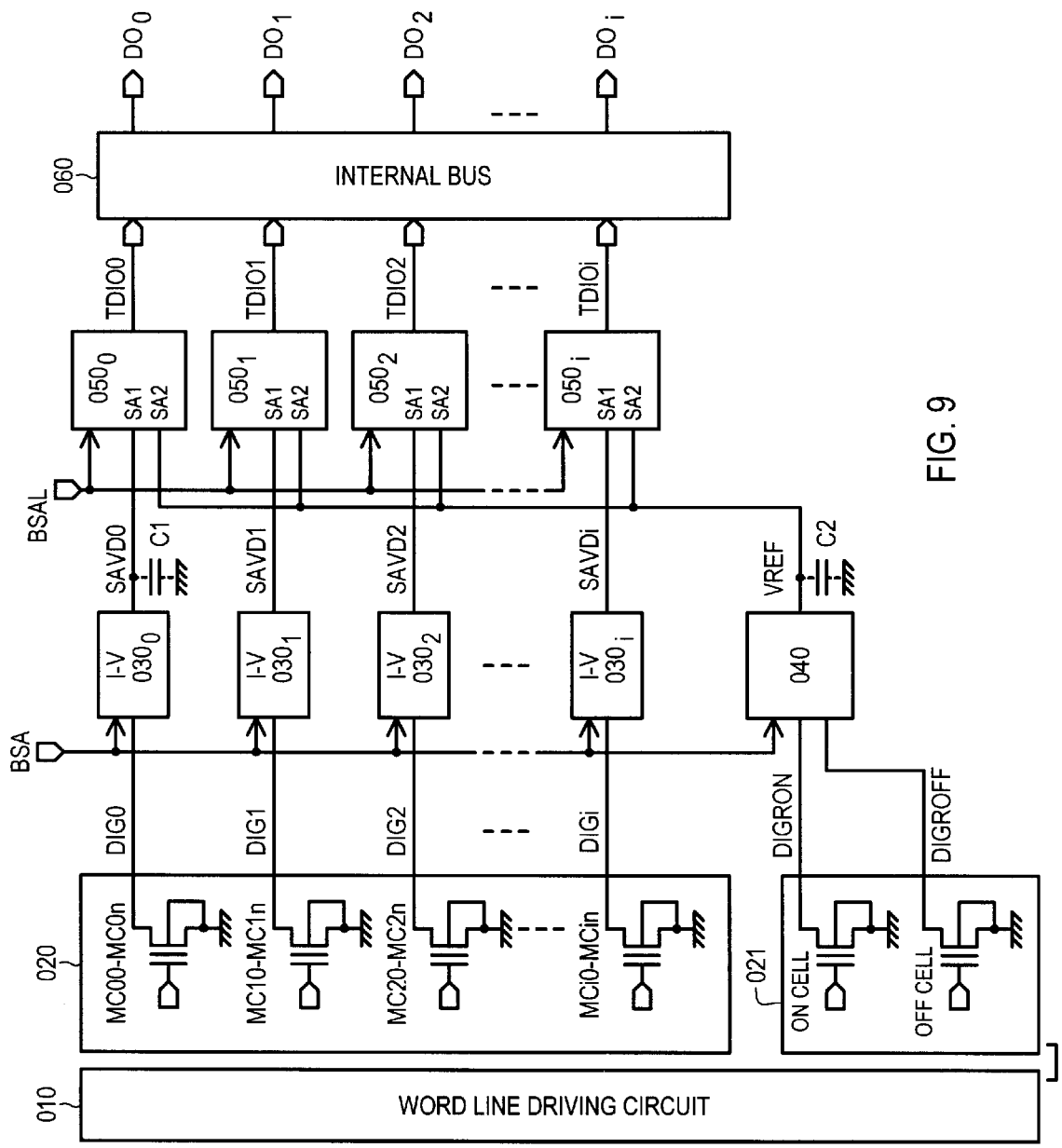
FIG. 9 is a block schematic diagram of a conventional electrically erasable programmable read only memory (EEPROM).
Figure 10:
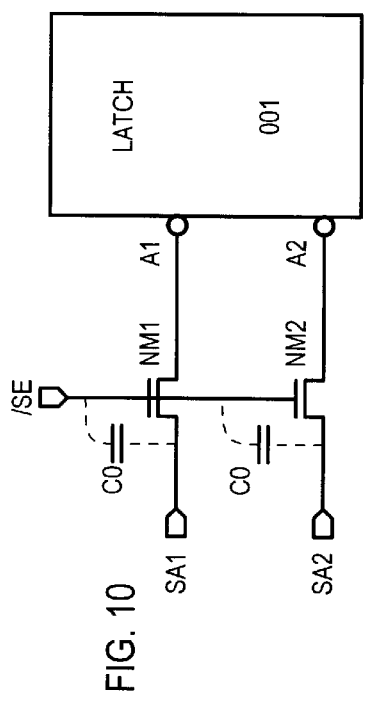
FIG. 10 is a block schematic diagram of a conventional latch-type sense amplifier.

Unlike the conventional case described above with reference to FIG. 9, sense amplifier circuits (050A$_0$–050A$_i$) can receive complementary sense amplifier latch activating signals BSAL and TSAL. Complementary transitions in such signals (BSAL and TSAL) can generate essentially complementary noise responses that can cancel one another.

Latch-type sense amplifier circuits ($050A_0$–$050A_i$) can provide sense amplifier outputs $TDIO_0$–$TDIO_i$ onto internal bus lines 060. Output data signals $DO_0$–$DO_i$ may then be provided from internal bus lines 060.

A semiconductor storage device may further include an interconnection arrangement between I-V converter circuits ($030_0$–$030_i$), latch-type sense amplifier circuits ($050A_0$–$050A_i$), and a reference voltage generating circuit 040. Such an interconnection arrangement can be like that described with reference to the conventional approach of FIG. 9. Namely, a load capacitance of a first input SA1, shown as C1 at the output of latch-type sense amplifier $050A_i$, can be substantially smaller than a load capacitance of a second input SA2, shown as C2 at the output of reference voltage generating circuit 040.

Having described a particular first embodiment of a semiconductor storage device, a latch-type sense amplifier circuit according the present invention will now be described with reference to FIGS. 1A and 1B.

Figure 1A:
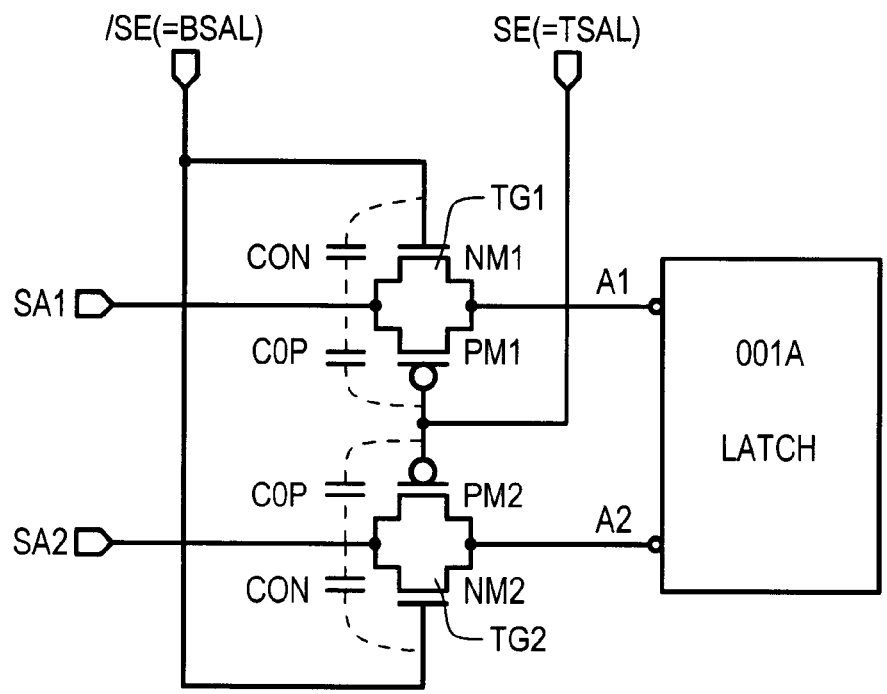
FIG. 1A is a block schematic diagram of a latch-type sense amplifier according to an embodiment of the present invention.

Referring now to FIG. 1A, a latch-type sense amplifier according the present invention may include an input section with a transfer gate. A transfer gate may include parasitic capacitance that can generate offsetting noise components. In the particular example of FIG. 1A, an input section includes two transfer gates TG1 and TG2. A first transfer gate may include a CMOS transfer gate formed with complementary transistors NM1 and PM1. A second transfer gate may include a CMOS transfer gate formed with complementary transistors NM2 and PM2. Transistors NM1 and NM2 may include n-channel field effect transistors and transistors PM1 and PM2 may include p-channel field effect transistors.

Input transistors NM1 and PM1 may have a source-drain paths connected between an input terminal SA1 and an amplifier terminal A1. Similarly, input transistors NM2 and PM2 may have a source-drain paths connected between an input terminal SA2 and an amplifier terminal A2. The gates of input transistors NM1 and NM2 may commonly receive a sense amplifier activating signal /SE (which can correspond to sense amplifier latch activating signal BSAL shown in FIG. 2). The gates of input transistors PM1 and PM2 may commonly receive a complementary sense amplifier activating signal SE (which can correspond to complementary sense amplifier latch activating signal TSAL shown in FIG. 2).

An input terminal SA1 may receive a voltage corresponding to a memory cell data value. Such a voltage may be provided by a I-V converter circuit. An input terminal SA2 may receive a reference voltage VREF from a reference voltage generating circuit.

Figure 1B:
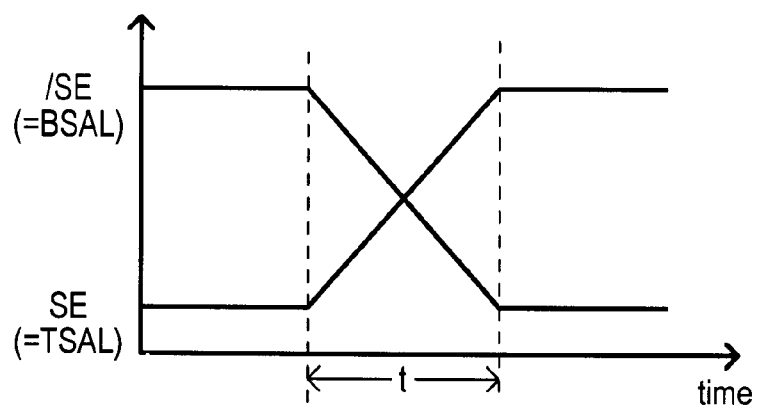
FIG. 1B is a timing diagram illustrating control signals for the circuit of FIG. 1A.

As shown in FIG. 1B, in one embodiment, complementary sense amplifier activating signals /SE and SE may crossover at essentially the same time. That is, the time it may take for sense amplifier activating signal /SE to transition from an inactive (high) level to an active (low) level can be essentially the same as the time it may take a complementary sense amplifier activating signal to transition from an inactive (low) level to an active (high) level. Further, such transitions may begin at essentially the same time.

It is understood that input transistors NM1 and NM2 may include sources connected to input terminals (SA1 and SA2) and drains connected to amplifier inputs (A1 and A2), or vice versa. Along these same lines, input transistors PM1 and PM2 may include drains connected to input terminals (SA1 and SA2) and sources connected to amplifier inputs (A1 and A2), or vice versa.

As shown in FIG. 1A, the various transistors of transfer gates TG1 and TG2 can include a parasitic capacitance with respect to input nodes SA1 and SA2. More particularly, a transistor NM1 may have a gate-source capacitance Cgs of C0N with respect to input SA1, while transistor PM1 may have a gate-drain capacitance Cgd of C0P. Similarly, a transistor NM2 may have a gate-source capacitance Cgs of C0N with respect to input SA2, while transistor PM2 may have a gate-drain capacitance Cgd of C0P. Of course, if n-channel transistors NM1 and NM2 were construed as having drains connected to inputs SA1 and SA2, capacitance C0N could be a gate-drain capacitance Cgd. Also, if p-channel transistors PM1 and PM2 were construed as having sources connected to inputs SA1 and SA2, capacitance C0P could be a gate-source capacitance Cgs.

According to one embodiment, a parasitic capacitance C0P for p-channel devices in a transfer gate (TG1 or TG2) can be essentially the same as a parasitic capacitance C0N for corresponding n-channel devices in a transfer gate (TG1 or TG2).

Referring now to FIGS. 1A and 1B, by setting essentially identical rise times and fall times for control signals of opposite phase (/SE and SE), and by supplying such opposite phase control signals to transfer gates TG1 and TG2, a noise cancellation effect can occur. Consequently, the effects of noise can be reduced, allowing timing margins (and thus sensing speeds) to be improved.

An operation of semiconductor storage device according to a first embodiment will now be described with reference to FIGS. 1A, 1B and 2. In a read operation, a sense amplifier activating signal BSA can transition to an active level. Once BSA is active, I-V converter circuits ($030_0$–$030_i$) can convert a current drawn on digit lines DIG0–DIGi into corresponding voltages $SAVD_0$–$SAVD_i$. In this way, voltages corresponding to memory cell data can be supplied to latch-type sense amplifier circuits ($050A_0$–$050A_i$).

An active sense amplifier activating signal BSA can also enable a reference voltage generating circuit 040. When activated, a reference voltage generating circuit 040 can supply a reference voltage to latch-type sense amplifier circuits ($050A_0$–$050A_i$).

Initially, complementary sense amplifier latch activating signals (/SE-SE and BSAL-TSAL) may both be inactive. Within a latch-type sense amplifier circuit ($050A_0$–$050A_i$ and FIG. 1A), a sense amplifier latch activating signal /SE may be high, while a complementary sense amplifier latch activating signal SE may be low. Consequently, the transistors of transfer gates TG1 and TG2 may all be turned on, enabling input voltages to be supplied to amplifier inputs A1 and A2. For example, a voltage representing a memory cell state (such as $SAVD_0$–$SAVD_i$) may be supplied to amplifier input A1, while a reference voltage (such as VREF) may be supplied to amplifier input A2.

Complementary sense amplifier latch activating signals (/SE-SE and BSAL-TSAL) may then transition, essentially simultaneously, to active levels. Within a latch-type sense amplifier circuit ($050A_0$–$050A_i$ and FIG. 1A), a sense amplifier latch activating signal /SE may transition low, while a complementary sense amplifier latch activating signal SE may transition high. Consequently, the transistors of transfer gates TG1 and TG2 may all be turned off. A voltage difference at amplifier inputs A1 and A2 can then be amplified and latched. Such amplified and latched values can be provided as amplifier outputs (such as $TDIO_0$–$TDIO_i$).

As was shown in FIG. 1B, when sense amplifier latch activating signals /SE and SE switch levels, a fall and rise time (t) can be essentially the same. Further, such fall and rise times may start at essentially the same time and have essentially the same response (e.g., absolute value of slope in the case of FIG. 1B).

Referring back to FIG. 1A, as will be recalled, input transistors of transfer gates TG1 and TG2 may present parasitic capacitance C0N and C0P. Due to such parasitic capacitance, transitions in sense amplifier latch activating signals /SE and SE can generate noise at inputs SA1 and SA2. However, as noted above, when one sense amplifier latch activating signal /SE transitions low, the other sense amplifier latch activating signal SE can transition high. Consequently noise voltages of opposite phases can be generated at an input terminal (such as SA1 or SA2).

More particularly with reference to FIG. 1A, it will be assumed that n-channel transistor NM1 of first transfer gate TG1 can have a parasitic capacitance of C0N. Further, an amplitude of a transition in a sense amplifier latch activating signal /SE can be –V and a load capacitance at an input SA1 can be C1. A load capacitance C1 can be at an output of IV converter circuit ($030_0$ to $030_i$). Thus, a first potential change component $VSA1^-$ at input node SA1 due to capacitive coupling can approximately be given as set forth below.

$$VSA1^- = (C0N/(C0N+C1)) \times (-V)$$

However, it will also be assumed that p-channel transistor PM1 of first transfer gate TG1 can have a parasitic capacitance of C0P. Further, an amplitude of a transition in a complementary sense amplifier latch activating signal SE can be +V. Thus, while sense amplifier latch activating signal /SE generates a noise component $VSA1^-$ at input SA1, complementary sense amplifier latch activating signal SE can generate complementary noise component at the same input SA1. Thus, a potential change component $VSA1^+$ at input node SA1 due to capacitive coupling can approximately be given as set forth below.

$$VSA1^+ = (C0P/(C0P+C1)) \times (+V)$$

It can be seen that when C0N=C0P, $VSA1^- + VSA1^+ = 0$. In this way, complementary noise components can cancel one another at an input node SA1.

In one particular embodiment, complementary transistors of transfer gates are designed to provide gate-source (or gate-drain) capacitances that are essentially equal to one another. That is, if reference is made to FIG. 1A, a parasitic gate-source capacitance of transistor NM1 (C0N) can be made the same as a parasitic gate-drain capacitance of transistor PM1 (C0P). Similarly, a parasitic gate-source capacitance of transistor NM2 (C0N) can be made the same as a parasitic gate-drain capacitance of transistor PM2 (C0P). As is well known in the art, gate-source Cgs and gate-drain Cgd capacitance are proportional to $(\epsilon_g/t_{ox})A$, where A represents an area of a transistor gate, $\epsilon_g$ represents a dielectric constant of a gate insulating film, and $t_{ox}$ represents a thickness of a gate insulating film.

Figure 3:
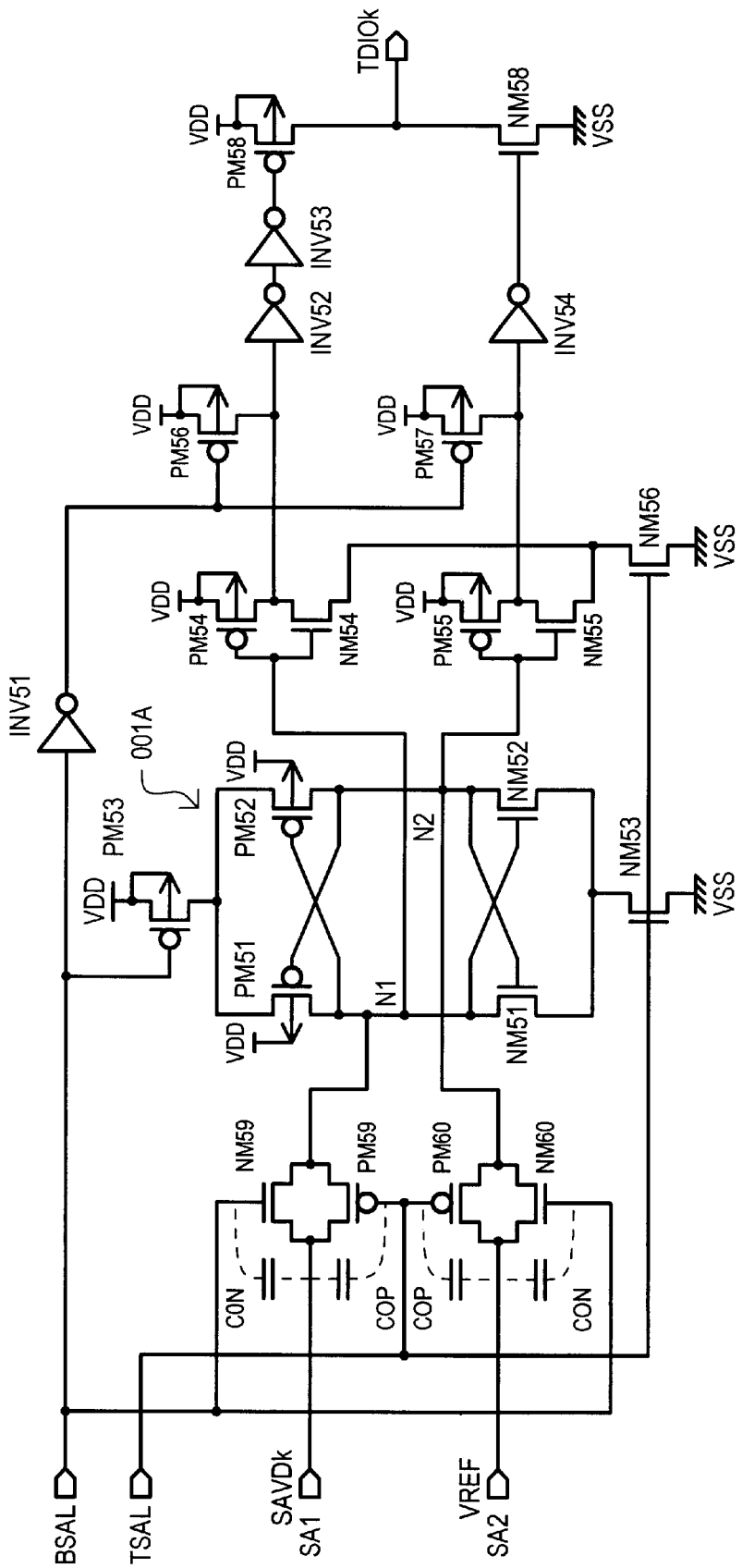
FIG. 3 is a detailed schematic diagram of a latch-type sense amplifier according to one embodiment.

Referring now to FIG. 3, a detailed schematic diagram is shown of a latch-type sense amplifier according to an embodiment. The latch-type sense amplifier of FIG. 3 may include many of the same circuit elements as that shown in FIG. 11. To that extent, like circuit portions will be referred to by the same reference character.

Figure 11:
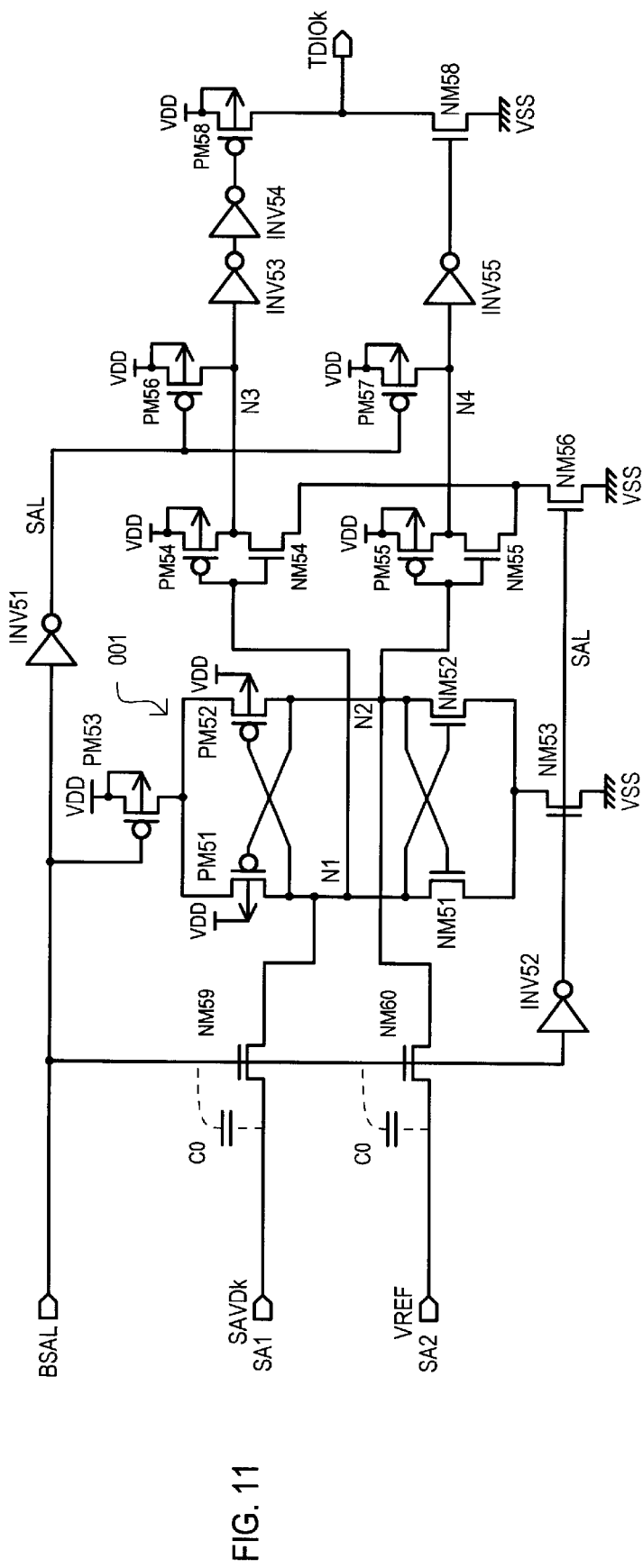
FIG. 11 is a detailed schematic diagram of a conventional latch-type sense amplifier.
Figure 12:
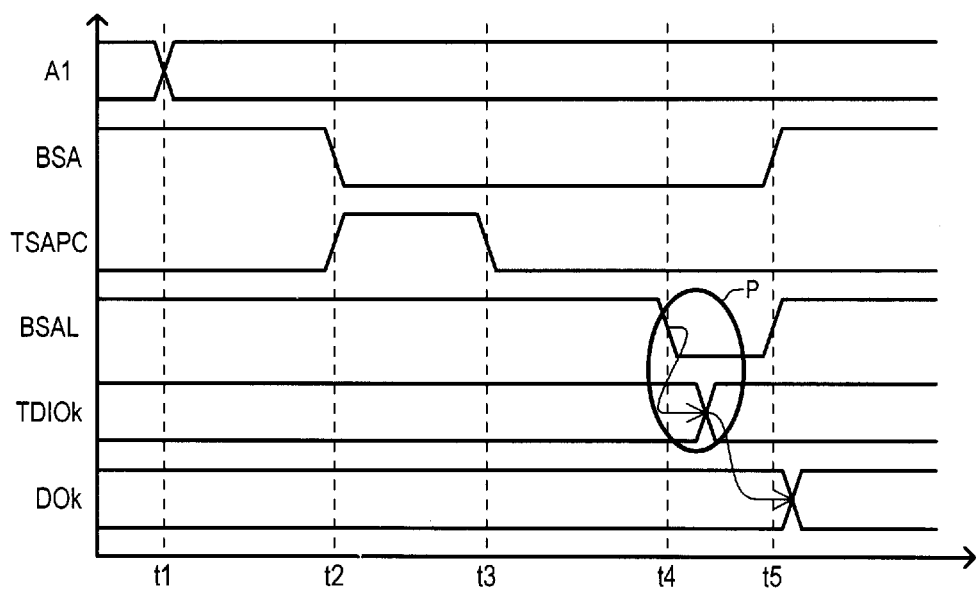
FIG. 12 is a timing diagram illustrating the operation of a non-volatile semiconductor storage device having conventional latch-type sense amplifiers.

FIG. 3 can differ from the conventional case of FIG. 11 in that a first transfer gate that includes n-channel transistor NM59 and p-channel transistor PM59. A first input SA1 may receive an input voltage from an I-V converter circuit SAVDk (where k=0–i) (such as 030k of FIG. 2). Transistor NM59 may receive a sense amplifier latch activating signal BSAL at its gate, while transistor PM59 may receive complementary sense amplifier latch activating signal TSAL at its gate. Further, a second transfer gate that includes n-channel transistor NM60 and p-channel transistor PM60. A second input SA2 may receive a reference voltage VREF from a reference voltage generating circuit (such as 040 of FIG. 2). Transistor NM60 may receive the BSAL signal at its gate, while transistor PM60 may receive the TSAL signal at its gate.

Thus, according to one embodiment, a latch-type sense amplifier as shown in FIG. 3 may include transfer gates having complementary transistor types between input nodes SA1 and SA2 and amplifier nodes N1 and N2. A latch-type sense amplifier of FIG. 3 can operate in a similar fashion to that of FIG. 1. That is, a potential difference between nodes N1 and N2 can be latched and amplified in latch 001A. Such an amplified potential difference may then be used to drive output devices PM58 and NM58 to thereby generate a high or low amplifier output signal TDIOk. A detailed discussion of such operations will therefore be omitted.

As in the case of the example of FIG. 11, a power supply voltage VDD of FIG. 3 is not necessarily limited to external voltages supplied to a semiconductor storage device. As but one example, a first power supply voltage VDD may be a "stepped-down" voltage generated by reducing an externally supplied voltage.

A latch-type sense amplifier of FIG. 3 can differ from the conventional case of FIG. 11 in that transfer gates NM59/PM59 and NM60/PM60 can provide noise cancellation like that described with reference to FIG. 1A. More particularly, high-to-low transitions in sense amplifier latch activating signal BSAL can generate low-going noise at inputs SA1 and SA2. Due to differences in load capacitance, such noise can be greater at first input SA1 than second input SA2. However, low-to-high transitions in complementary sense amplifier latch activating signal TSAL can generate high-going noise that can serve to cancel the previously described low-going noise. In this way, noise effects at inputs SA1 and SA2 due to capacitive coupling can be reduced and/or cancelled.

A I-V converter circuit will now be described with reference to FIG. 5. A circuit such as that shown in FIG. 5 may be used as a I-V converter circuit shown as $030_0$–$030_i$ in FIG. 2. A I-V converter circuit may include an output stage having a supply control transistor PM32, a voltage control transistor PM33, and a load transistor NM32 having source-drain paths arranged in series between first power supply voltage VDD and a second power supply voltage VSS. A supply control transistor PM32 can be a p-channel transistor with a gate that receives a sense amplifier activating signal BSA. A voltage control transistor PM33 can be a p-channel transistor with a gate connected to a control section (described below). A load transistor NM32 can be an n-channel transistor in a "diode" configuration. A drain-drain connection between transistors PM33 and NM32 can provide a sense amplifier output SAVDk.

Figure 5:
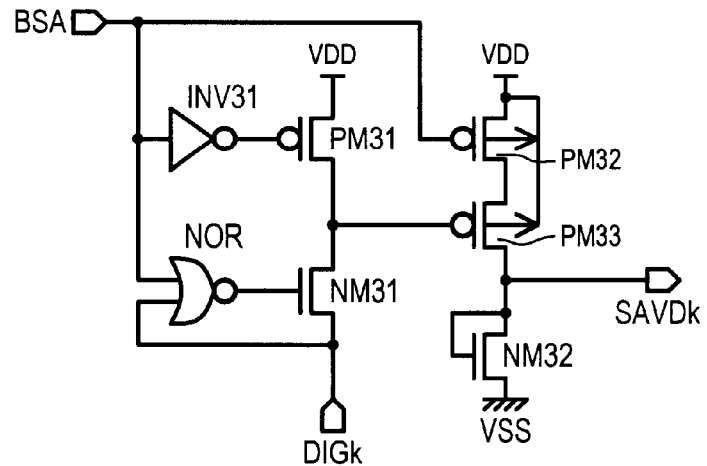
FIG. 5 is a schematic diagram of a current-to-voltage converter circuit according to one embodiment.

A I-V converter circuit according to FIG. 5 may have a control section that includes a disabling transistor PM31, a current path transistor NM31, a logic gate NOR and an inverter INV31. A disabling transistor PM31 can be a p-channel transistor having a source-drain path between a first power supply voltage VDD and the gate of voltage control transistor PM33. A current path transistor NM31 can be an n-channel transistor having a source-drain path between a digit line DIGk and the gate of voltage control transistor PM33. A logic gate NOR can be a NOR gate with one input that receives a sense amplifier activation signal BSA and another input connected to the digit line DIGk. An inverter INV31 can invert a sense amplifier activation signal BSA and apply it to disabling transistor PM31.

A I-V converter circuit according to FIG. 5 can be inactive when sense amplifier activation signal BSA is high. With signal BSA high, supply control transistor PM32 can be turned off. A high BSA signal can be inverted by inverter INV31 that can then turn on disabling transistor PM31. When disabling transistor PM31 is turned on, voltage control transistor PM33 can be turned off. A high BSA signal can force the output of logic gate NOR low, which can turn off current path transistor NM31.

A I-V converter circuit according to FIG. 5 can then be activated when sense amplifier activation signal BSA is low. With signal BSA low, supply control transistor PM32 can be turned on. A high BSA signal can be inverted by inverter INV31 that can then turn off disabling transistor PM31. A low BSA signal can allow logic gate NOR to essentially function like an inverter with respect to a digit line potential DIGk. At the same time a current can be drawn on digit line DIGk by a memory cell.

A current drawn on a digit line DIGk can vary according to the state of a selected memory cell. If a selected memory cell is an "on" cell (e.g., initial condition), a digit line may draw an on current. If a selected memory cell is an "off" cell (e.g., programmed condition), a digit line may draw an off current. According to the convention of the example shown, an on current may be greater than an off current.

Depending upon the particular type of current drawn (i.e., on or off), a potential at the drain of current path transistor NM31 can go lower or higher. In particular, because an on current can be larger than an off current, the drain of current path transistor NM31 can fall to a lower potential when an on memory cell is read as compared to when an off memory cell is read.

A variation in the drain potential of current path transistor NM31 can translate into a variation in the potential at the gate of voltage control transistor PM33. In particular, a lower drain potential of current path transistor NM31 can result in a lower gate voltage at voltage control transistor PM33. Because supply transistor PM32 is turned on, a lower gate voltage at voltage control transistor PM33 can result in a higher output voltage SAVDk. In this way, changes in a current drawn by a digit line DIGk can result in changes in potential in an output signal SAVDk of a I-V converter circuit.

A reference voltage generating circuit will now be described with reference to FIG. 6. The circuit of FIG. 6 may be used as a reference voltage generator such as that shown as 040. According to the arrangement of FIG. 6, a reference voltage generating circuit may include two I-V converter circuits, such as that shown in FIG. 5. In particular, a first reference I-V converter circuit may have an output stage that includes p-channel transistors PM43, PM44 and NM43, and a control section that includes p-channel transistor PM41, n-channel transistor NM41, logic gate NOR41, and inverter INV41. Within a first reference I-V converter circuit, a current supply transistor NM41 can have a source connected to a reference line DIGRON that can draw an "on memory cell current.

Figure 6:
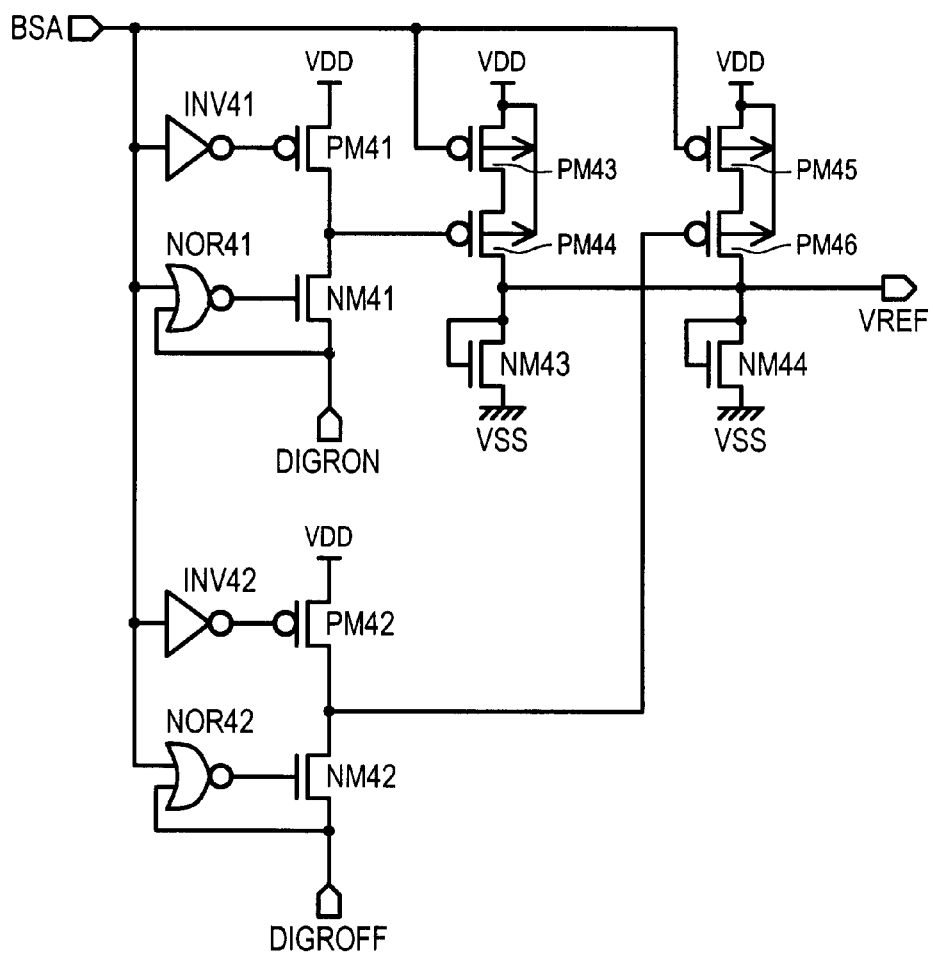
FIG. 6 is a schematic diagram of a reference voltage generating circuit according to one embodiment.

The circuit of FIG. 6 may also include a second reference I-V converter circuit having an output stage that includes p-channel transistors PM45, PM46 and NM44, and a control section that includes p-channel transistor PM42, n-channel transistor NM42, logic gate NOR42, and inverter INV42. Within a second reference I-V converter circuit, a current supply transistor NM42 can have a drain connected to a reference line DIGROFF that can draw an "off" memory cell current.

The output stages of the first and second reference I-V converter circuits may be commonly connected to an output node that supplies a reference voltage VREF. The different responses of such output stages can generate the reference voltage VREF.

Figure 7:
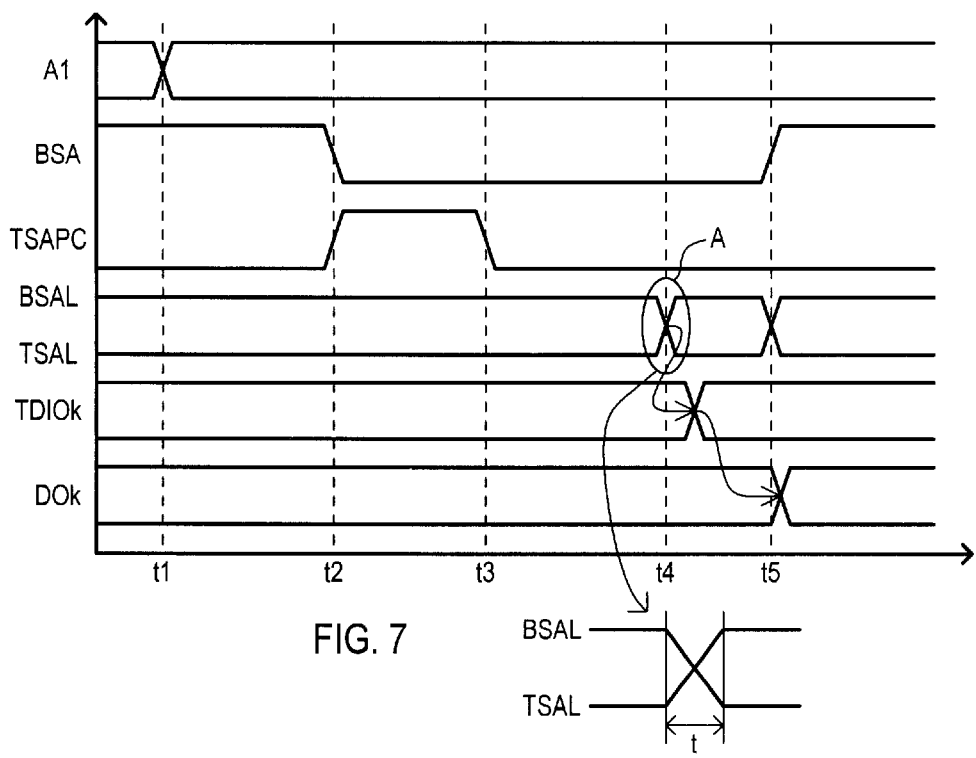
FIG. 7 is a timing diagram showing the operation of a non-volatile semiconductor storage device according to one embodiment.

FIG. 7 shows a timing diagram that illustrates the operation of a non-volatile semiconductor storage device, such as that shown in FIG. 2. FIG. 7 shows an address A1, a sense amplifier activation signal BSA, an equalization signal TSAPC, complementary sense amplifier latch activating signals BSAL and TSAL, an output value TDIOk, and a data value DOk.

Referring now to FIG. 7 in conjunction with FIG. 2, at time t1, an address can make a transition to a new read address. Such a read address may be decoded by a row address decoder and a column address decoder (both not shown).

At time t2, a sense amplifier control signal BSA can become active (low in this example). An active sense amplifier control signal BSA can activate I-V converter circuits $030_k$ (where k=0–i) and a reference voltage generating circuit 040. Also at time t2, an equalization signal TSAPC can be activated. An active equalization signal TSAPC can precharge digit lines DIG0–DIGi to a predetermined potential.

At time t3, an equalization signal can return to an inactive state, disabling precharge circuits. Thereafter, in response to the applied read address A1, at least one memory cell can be selected, resulting in current being drawn on a digit line.

A current drawn on a digit line can be converted to a voltage by a I-V converter circuit $030_k$ and the resulting voltage $SAVD_k$ can be applied to a first input of a latch-type sense amplifier $050_k$. Because a sense amplifier latch enable signal can be inactive, such a voltage can be provided to a first node of the latch. At the same general time, a reference voltage generating circuit 040 can generate a reference voltage VREF in response to DIGRON and DIGROFF currents. Such a reference voltage VREF can be applied to a second input of a latch-type sense amplifier $050_k$. Because a sense amplifier latch enable signal can be inactive, such a voltage can be provided to a second node of the latch.

Between times t4 and t5, complementary sense amplifier latch activating signals BSAL and TSAL can be activated, resulting in latch-type sense amplifiers $050A_k$ amplifying and latching a data value. As described above, noise generated by a sense amplifier latch activating signal BSAL can be reduced and/or cancelled by noise generated from a complementary sense amplifier latch activating signals TSAL.

Memory cell data values that are latched and amplified by latch-type sense amplifiers $050A_k$ can be provided as amplifier outputs TDIOk. A corresponding transition can then occur for a data output signal $DO_k$.

FIG. 7 also provides a more detailed view of transitions in complementary sense amplifier latch activating signals (BSAL and TSAL). In particular, such signals are shown to have transition times of the same duration t. Such transitions may have a midway crossover point and begin at essentially the same time.

Figure 8:
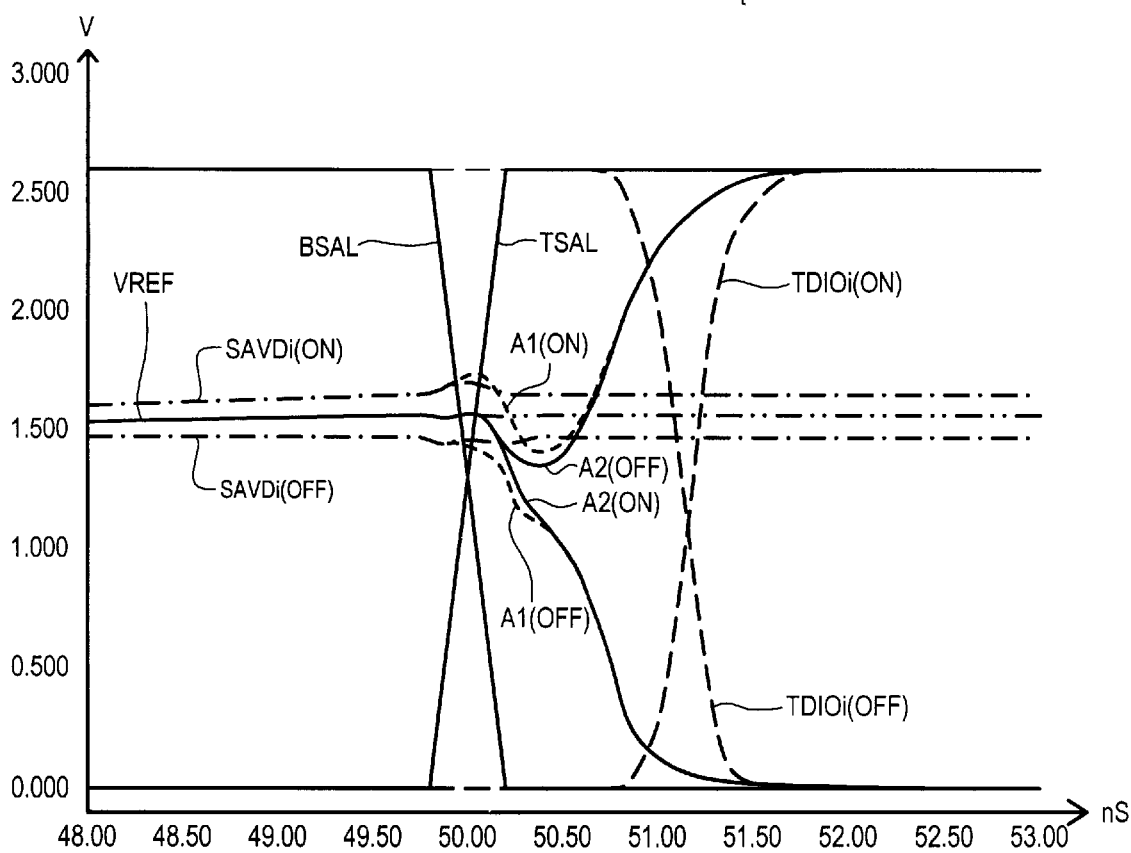
FIG. 8 is a timing diagram illustrating the response of a latch-type sense amplifier according to one embodiment.

FIG. 8 is a timing diagram generated by a circuit simulation SPICE® that shows the response of a latch-type sense amplifier such as that shown in FIG. 3. FIG. 8 includes various responses and signals. A sense amplifier latch activating signal BSAL can transition from a high level to a low level. At essentially the same general time, a complementary sense amplifier latch activating signal can transition from a low level to a high level. Also included are two output signals TDIOi(ON) and TDIOi(OFF). TDIOi(ON) can represent an output signal corresponding to an "on" memory cell (i.e., a memory cell in an initial condition). TDIOi(OFF) can represent an output signal corresponding to an "off" memory cell (i.e., a memory cell in a programmed condition).

Input waveforms corresponding to such different types of memory cells are also shown. A waveform SAVDi(ON) can represent the voltage at a first input, such as SA1, that may result when an on memory cell is read. A waveform SAVDi (OFF) can represent the voltage at a first input, such as SA1, that may result when an off memory cell is read. Responses SAVDi(ON) and SAVDi(OFF) may be provided by a I-V converter circuit or the like. A waveform VREF can represent the voltage at a second input, such as SA2. Such a voltage may be provided by a reference voltage generating circuit, or the like. Thus, if an on memory cell is read, the voltage at node SA1 (SAVDi(ON)) can initially be greater than VREF. Conversely, if an off memory cell is read, the voltage at node SA1 (SAVDi(OFF)) can initially be less than VREF.

FIG. 8 further shows the response of latch inputs A1 and A2. In particular, the response at a first latch input for an on memory cell is shown as A1(ON), while the response at a first latch input for an off memory cell is shown as A1(OFF). Similarly, a response at a second latch input for an on memory cell is shown as A2(ON), while the response at a second latch input for an off memory cell is shown as A2(OFF).

Figure 13:
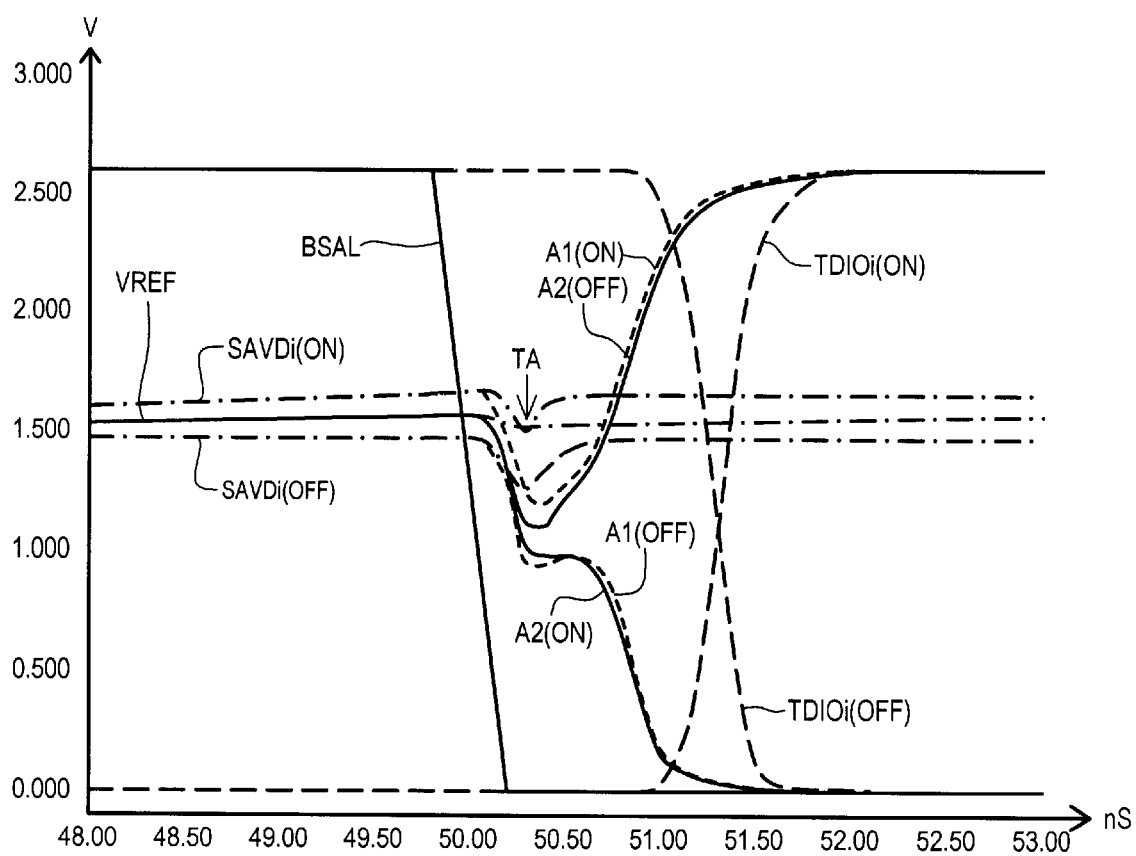
FIG. 13 is a timing diagram illustrating the response of a conventional latch-type sense amplifier.

FIG. 8, when viewed with respect to FIG. 13, shows how noise may be cancelled. In particular, noise due to capacitive coupling for a high-to-low transition in a BSAL may be essentially cancelled by noise due to capacitive coupling for a low-to-high transition in a TSAL signal. Thus, there can be relatively little disturbance in the SAVDi(ON) response in FIG. 8 when compared to that of FIG. 13.

In one particular example, a voltage change due to a transitions in the sense amplifier latch activating signals (BSAL and TSAL) from capacitive coupling can result in changes at a first node SA1 (SAVDi(ON) and/or SAVDi (OFF)) that may be as low as 10 mV. This can represent about 1/10 of the noise as compared to the conventional response shown in FIG. 13. Of course, noise cancellation may occur with respect to the reference voltage VREF as well.

In this way, according to embodiments of the present invention, changes in potential at sense amplifier input nodes SA1 and SA2 caused by capacitive coupling due to transitions in a sense amplifier latch activating signal can be reduced. Such reductions can substantially reduce the undesirable response where an amplifier input terminal A1 erroneously falls below or above a reference voltage at another input terminal A2.

One way to measure a speed of a latch-type sense amplifier can be to determine the time period between a transition in the sense amplifier latch activating signal BSAL and the at which an amplifier output (TDIOi(ON) or TDIOi(OFF)) is driven to about a first power supply level (e.g., VDD) or a second power supply level (e.g., VSS). In the case of the present invention such a time period may be as small as 1.5 ns. In contrast, in a conventional approach such as that shown in FIG. 13, such a time period may be about 2 ns. Thus, significant reductions in access time can result for a latch-type sense amplifier according to the present invention when compared to conventional latch type sense amplifiers.

In addition to improvements in speed, by reducing potential changes due to noise, the present invention may prevent variations at a first input SA1 that could, in a conventional case, cause a first input potential to fall below a second input SA1 potential and thereby produce erroneous results.

It is further noted that latch-type sense amplifiers (such as $030A_0$–$030A_i$) may be separated from one another in a semiconductor storage device. Thus, as may be understood with reference to FIG. 2, due to signal propagation delay, complementary sense amplifier latch activating signals BSAL and TSAL may arrive at each latch-type sense amplifier ($030A_0$–$030A_i$) slightly offset with respect to time. Such a slight offset can prevent switching noise (from BSAL and TSAL) from simultaneously overlapping one another.

It is understood that while the particular arrangement of FIGS. 1A and 3 show a latch-type sense amplifier that can include CMOS type transfer gates between both inputs SA1 and SA2 alternate embodiments may differ. For example, as noted above, due to differences in a load capacitance C1 at a first input and a load capacitance C2 at a second input (i.e., C1<<C2), noise at a second input SA2 can be less than that of a first input. Consequently, where noise at a second input SA2 is substantially less than that of a first input SA1, a CMOS type transfer gate can connect a first input SA1 to one amplifier input/node (A1/N1) while a single transistor, such as an n-channel transistor, can connect a second input SA2 to another amplifier input/node (A2/N2).

Figure 4:
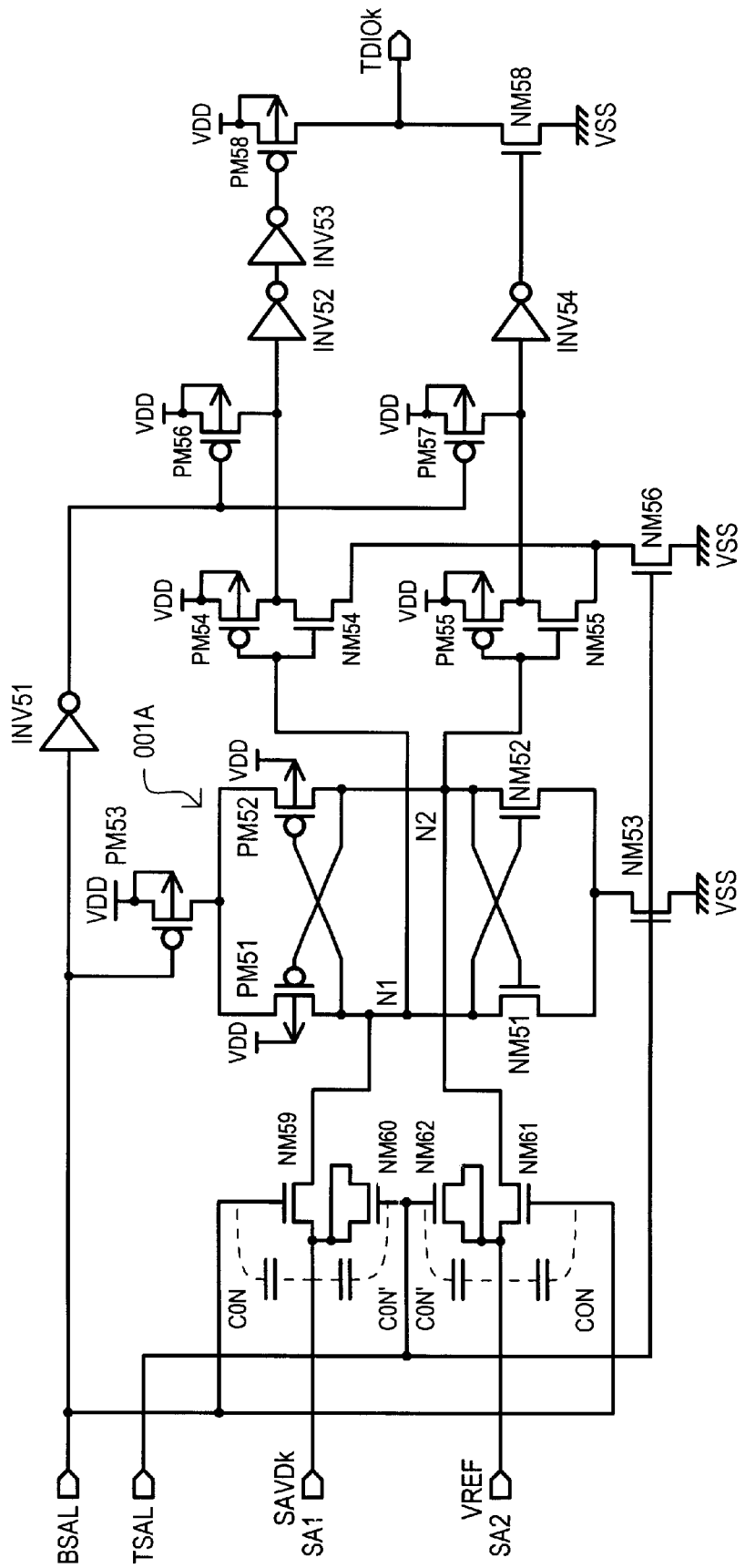
FIG. 4 is a block schematic diagram of a latch-type sense amplifier according to another embodiment.

A second embodiment will now be described with reference to FIG. 4. FIG. 4 shows a latch-type sense amplifier circuit that includes an input circuit with transfer gates that may differ from those previously described.

A first transfer gate may be situated between a first input SA1 and an amplifier node N1, and can include a transistor NM59 and a compensating device NM60. Similarly, a second transfer gate may be situated between a second input SA2 and another amplifier node N2, and can include a transistor NM61 and a compensating device NM62. In the particular example of FIG. 4, transistors NM59 and NM61 and compensating devices NM60 and NM62 may include n-channel transistors.

Transistor NM59 can have a source-drain path between first input SA1 and node N1, and a gate that receives sense amplifier latch activating signal BSAL. Transistor NM59 can have a parasitic gate-source capacitance Cgs, which is shown in FIG. 4 as C0N. Transistor NM61 can have a source-drain path between second input SA2 and node N2, and a gate that also receives sense amplifier latch activating signal BSAL. Like transistor NM59, transistor NM61 can have a parasitic gate-source capacitance Cgs, which is also shown as C0N.

Compensating device NM60 can provide a capacitance C0N' equivalent to that of its corresponding transfer gate transistor NM59. Thus, in FIG. 4, compensating device NM60 can include a capacitor connected transistor having source and drains connected to first input SA1. A gate of compensating device NM60 can receive a TSAL signal, which can be the complement of the sense amplifier latch activating signal BSAL received at the gate of transistor NM59. Similarly, compensating device NM62 can provide a capacitance C0N' equivalent to that of its corresponding transfer gate transistor NM61, and can include a capacitor connected transistor having source and drains connected to second input SA2. A gate of compensating device NM62 can receive the TSAL signal.

Like previously described embodiments, a first input SA1 can receive a voltage representative of a memory cell SAVDk, from a I-V converter circuit, for example. A second input SA2 can receive a reference voltage VREF from a reference voltage generating circuit, for example. In addition, complementary sense amplifier activating signals BSAL and TSAL can fall and rise, respectively, in the same amount of time.

While a second embodiment of FIG. 4 includes compensating devices NM60 and NM62 that do not provide transmission of an input signal, such devices can reduce noise as in the previously described embodiments. Namely, the switching of sense amplifier activating signal BSAL may generate noise at first input SA1 due to parasitic capacitance C0N. However, at essentially the same time, the switching of complementary sense amplifier activating signal TSAL may also generate noise at first input SA1 due to parasitic capacitance C0N' of compensating device NM60, where such noise can reduce and/or cancel the noise generated in response to the BSAL signal. Further, the switching of sense amplifier activating signal BSAL may also generate noise at second input SA1 due to parasitic capacitance C0N that is compensated for by parasitic capacitance C0N' of compensating device NM62.

It is understood that while the embodiment of FIG. 4 shows a latch-type sense amplifier that can include compensating devices NM60 and NM62 that are connected to both inputs SA1 and SA2 alternate embodiments may include fewer compensating devices. For example, as noted with respect to the other embodiments, noise at a second input SA2 can be less than that of a first input SA1. Consequently, where noise at a second input SA2 is substantially less than that of a first input SA1, a compensating device may be connected to a first input SA1, but not included for a second embodiment SA2.

The above embodiments have described in conjunction with non-volatile semiconductor storage devices, including electrically programmable read-only-memories (EPROMs), electrically erasable programmable ROMs (EEPROMs), and like. However, while the present invention may provide improvements in speed and/or reliability for such devices, the present invention should not be construed as being limited thereto. In particular, the present invention may be applicable other memory devices and/or integrated circuits that may include sense amplifiers, more particularly, latch-type sense amplifiers.

According to the disclosed embodiments a latch-type sense amplifier may receive voltage signals representative of memory cell data from I-V converter circuits. Noise generated at an input of the latch-type sense amplifier, due to capacitive coupling, can be reduced. One way in which such noise can be reduced is by including a transfer gate at the input of a latch-type sense amplifier that can have two parasitic capacitances that are essentially equal. Such parasitic capacitance may receive complementary activating signals. Noise generated by one activating signal may be reduced and/or cancelled by noise generated from a complementary activating signal.

According to the disclosed embodiments, the timing margin of a latch-type sense amplifier may be improved. Such improvements may be achieved as the difference between an input signal and a reference signal can be more stable due to noise cancellation. Consequently, it may be possible to activate amplifying circuits sooner than in conventional approaches, such as that represented by FIGS. 10–13.

While the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A sense amplifier circuit, comprising:
   a first transfer gate, including
      a first input that receives a voltage generated in response to a current flowing on a digit line;
      a first transistor having a controllable impedance path between the first input and a first amplifier input, the first transistor being controlled by a first control signal received at a first control terminal, the switching of the first control signal generating a first noise component at the first input; and
      a first compensating device coupled to the first input, the first compensating device receiving a second control signal at a second control terminal, the switching of the second control signal generating a second noise component at the first input that cancels at least a portion of the first noise component.

2. The sense amplifier circuit of claim 1, wherein:
   the first transistor comprises an insulated gate field effect transistor (IGFET) having a first source/drain terminal coupled to a the first input and a second source/drain terminal coupled to the first amplifier input; and
   the first compensating device comprises an IGFET having at least one source/drain terminal coupled to the first input.

3. The sense amplifier circuit of claim 2, wherein:
   the first transistor comprises an IGFET of a first conductivity type; and
   the first compensating device IGFET is of a second conductivity type and includes a first source/drain terminal coupled to a the first input and a second source/drain terminal coupled to the first amplifier input.

4. The sense amplifier of claim 2, wherein:
   the first compensating device IGFET includes first and second source/drain terminals coupled to the first input.

5. The sense amplifier of claim 1, wherein:
   the first transistor includes a first capacitance between the first input and the first control terminal;
   the first compensating device includes a second capacitance between the first input and the second control terminal; and
   the second control signal switches in a complementary fashion to the first control signal to generate the second noise component.

6. The sense amplifier circuit of claim 1, further including:
   a second transfer gate, including
   a second input that receives a reference voltage;
   a second transistor having a controllable impedance path between the second input and a second amplifier input, the second transistor being controlled by the first control signal received at a third control terminal, the switching of the first control signal generating a third noise component at the second input; and
   a second compensating device coupled to the second input, the second compensating device receiving the second control signal at a fourth control terminal, the switching of the second control signal generating a fourth noise component at the second input that cancels at least a portion of the third noise component.

* * * * *